(12) United States Patent
Deguchi

(10) Patent No.: US 12,193,147 B2
(45) Date of Patent: Jan. 7, 2025

(54) ELECTRONIC COMPONENT

(71) Applicant: Murata Manufacturing Co., Ltd., Kyoto (JP)

(72) Inventor: Ikuo Deguchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 224 days.

(21) Appl. No.: 18/067,826

(22) Filed: Dec. 19, 2022

(65) Prior Publication Data

US 2023/0119498 A1    Apr. 20, 2023

Related U.S. Application Data

(63) Continuation of application No. PCT/JP2021/022098, filed on Jun. 10, 2021.

(30) Foreign Application Priority Data

Jun. 22, 2020 (JP) ................. 2020-107024

(51) Int. Cl.
*H05K 1/02* (2006.01)
*H01F 27/36* (2006.01)
*H01G 2/22* (2006.01)

(52) U.S. Cl.
CPC ......... *H05K 1/0216* (2013.01); *H01F 27/363* (2020.08); *H01G 2/22* (2013.01); *H05K 2201/0715* (2013.01); *H05K 2201/10015* (2013.01); *H05K 2201/1003* (2013.01)

(58) Field of Classification Search
CPC .............. H05K 1/0216; H05K 1/0224; H05K 2201/0919; H05K 2201/09354; H05K 2201/0715; H05K 1/0218
See application file for complete search history.

(56) References Cited

U.S. PATENT DOCUMENTS

2015/0126134 A1    5/2015  Lobianco et al.
2018/0286816 A1   10/2018  Kitazaki et al.
2019/0295959 A1    9/2019  Ishida et al.

FOREIGN PATENT DOCUMENTS

| JP | 2010-212410 A | 9/2010 |
| JP | 2015-91135 A | 5/2015 |
| JP | 2018-170419 A | 11/2018 |
| WO | 2017/212965 A1 | 12/2017 |

OTHER PUBLICATIONS

International Search Report for PCT/JP2021/022098 dated Aug. 3, 2021.

*Primary Examiner* — Jeremy C Norris
(74) *Attorney, Agent, or Firm* — Pearne & Gordon LLP

(57) ABSTRACT

An electronic component includes: an insulating substrate including a first main surface and a second main surface opposite to each other in a thickness direction and a side surface with a plurality of ground electrodes exposed thereto; conductive films each covering a surface of a corresponding one of the plurality of ground electrodes exposed to the side surface of the insulating substrate; and a shielding film covering the first main surface and the side surface of the insulating substrate and surfaces of the conductive films. The plurality of ground electrodes includes a first ground electrode and a second ground electrode, the first ground electrode and the second ground electrode being exposed to the side surface of the insulating substrate at a position closest to the first main surface and at a position closest to the second main surface, respectively.

20 Claims, 3 Drawing Sheets

ELECTRONIC COMPONENT

CROSS REFERENCE TO RELATED APPLICATION

This is a continuation of International Application No. PCT/JP2021/022098 filed on Jun. 10, 2021 which claims priority from Japanese Patent Application No. 2020-107024 filed on Jun. 22, 2020. The contents of these applications are incorporated herein by reference in their entireties.

BACKGROUND OF THE DISCLOSURE

Field of the Disclosure

The present disclosure relates to electronic components.

Description of the Related Art

Some electronic components mounted on mobile devices and others are provided with a shielding film to block magnetic waves.

For example, Patent Literature 1 discloses a shielded packaged device including an insulating substrate; a die mounted on the upper surface of the insulating substrate; an overmold encapsulating the die; and a conformal conductive coating covering the upper surface and side surfaces of the overmold and the side surfaces of the insulating substrate. The side surfaces of the insulating substrate are provided with multiple conductive layers and these conductive layers are electrically connected with the conformal conductive coating so that the conformal conductive coating functions as a shielding film.

PATENT LITERATURE

Patent Literature 1: JP 2015-91135 A

BRIEF SUMMARY OF THE DISCLOSURE

A shielding film on side surfaces of an insulating substrate may be formed by sputtering, for example. In order to prevent formation of the shielding film on the mounting surface of the insulating substrate, sputtering is performed with the insulating substrate being placed such that the surface opposite to the mounting surface faces the target. In some cases, unfortunately, the shielding film may be unnecessarily deposited on the mounting surface. The shielding film formed on the mounting surface may cause defects such as short circuits.

The present disclosure is made to solve the above issue and aims to provide an electronic component that less easily suffers short circuits.

The electronic component of the present disclosure includes: an insulating substrate including a first main surface, a second main surface, a side surface and a plurality of ground electrodes, the first main surface and the second main surface being opposite to each other in a thickness direction, and the plurality of ground electrodes being exposed to the side surface; conductive films each covering a surface of a corresponding one of the plurality of ground electrodes exposed to the side surface of the insulating substrate; and a shielding film covering the first main surface and the side surface of the insulating substrate and surfaces of the conductive films, the plurality of ground electrodes including a first ground electrode and a second ground electrode, the first ground electrode being exposed to the side surface of the insulating substrate at a position closest to the first main surface of the insulating substrate and the second ground electrode being exposed to the side surface of the insulating substrate at a position closest to the second main surface of the insulating substrate, the conductive films including a first conductive film covering a surface of the first ground electrode and a second conductive film covering a surface of the second ground electrode, a thickness of the second conductive film being greater than a thickness of the first conductive film.

The present disclosure can provide an electronic component that less easily suffers short circuits.

DETAILED DESCRIPTION OF THE DISCLOSURE

The electronic component of the present disclosure is described hereinbelow.

The present disclosure is not limited to the following preferred embodiments, and may be suitably modified without departing from the gist of the present disclosure. Combinations of two or more preferred structures described in the following are also within the scope of the present disclosure.

<Electronic Component>

The electronic component of the present disclosure includes: an insulating substrate including a first main surface and a second main surface opposite to each other in a thickness direction and a side surface with a plurality of ground electrodes exposed thereto; conductive films each covering a surface of a corresponding one of the plurality of ground electrodes exposed to the side surface of the insulating substrate; and a shielding film covering the first main surface and the side surface of the insulating substrate and surfaces of the conductive films, the plurality of ground electrodes including a first ground electrode and a second ground electrode, the first ground electrode being exposed to the side surface of the insulating substrate at a position closest to the first main surface of the insulating substrate and the second ground electrode being exposed to the side surface of the insulating substrate at a position closest to the second main surface of the insulating substrate, the conductive films including a first conductive film covering a surface of the first ground electrode and a second conductive film covering a surface of the second ground electrode, a thickness of the second conductive film being greater than a thickness of the first conductive film.

In the electronic component of the present disclosure, the thickness of the second conductive film covering the surface of the second ground electrode at a position closest to the second main surface of the insulating substrate among the ground electrodes is greater than the thickness of the first conductive film covering the surface of the first ground electrode at a position closest to the first main surface of the insulating substrate. Thus, the shielding film is less easily formed at a region closer to the second main surface than the second conductive film in a side surface of the insulating substrate. This prevents unnecessary deposition of the shielding film on the second main surface, which less easily causes short circuits.

An example of the structure of the electronic component is described with reference to FIG. 1 and FIG. 2.

Figure 1:
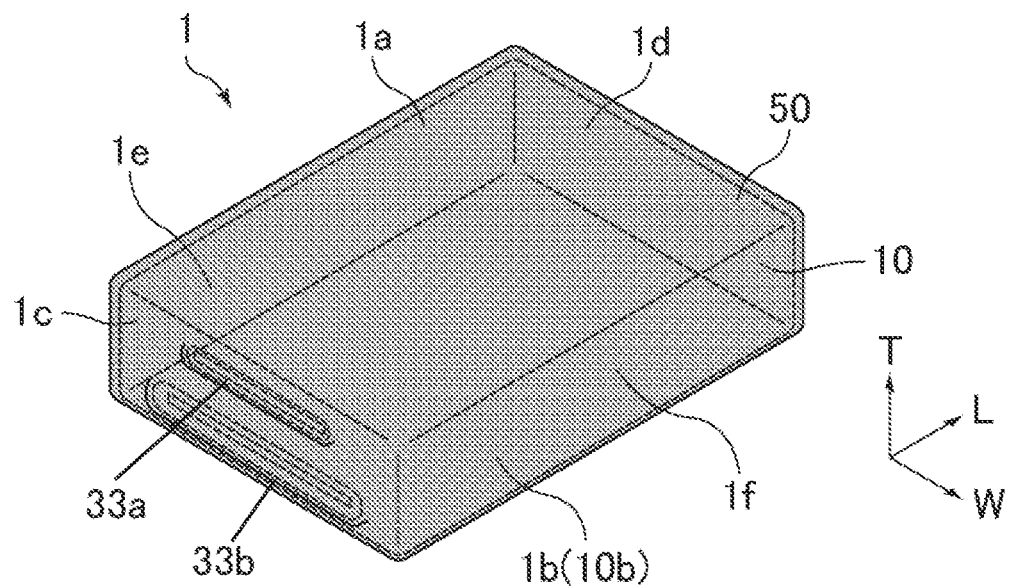
FIG. 1 is a schematic perspective view of an example of an electronic component.

FIG. 1 is a schematic perspective view of an example of the electronic component. FIG. 2 is a schematic perspective view of an insulating substrate defining the electronic component illustrated in FIG. 1.

An electronic component 1 illustrated in FIG. 1 includes an insulating substrate 10, conductive films (a conductive film 33a and a conductive film 33b), and a shielding film 50 covering one of the main surfaces (a first main surface 10a) and four side surfaces (a first side surface 10c, a second side surface 10d, a third side surface 10e, and a fourth side surface 10f) among the surfaces of the insulating substrate 10. The shielding film 50 also covers the surfaces of the conductive films.

The electronic component 1 has a shape including a first main surface 1a and a second main surface 1b opposite to each other in the thickness direction (the direction indicated by an arrow T in FIG. 1), a first side surface 1c and a second side surface 1d opposite to each other in the length direction (the direction indicated by an arrow L in FIG. 1) perpendicular to the thickness direction, and a third side surface 1e and a fourth side surface 1f opposite to each other in the width direction (the direction indicated by an arrow W in FIG. 1) perpendicular to the thickness direction and the length direction.

The shielding film 50 is provided on the first main surface 1a, the first side surface 1c, the second side surface 1d, the third side surface 1e, and the fourth side surface 1f of the electronic component 1, but is not provided on the second main surface 1b thereof.

A second main surface 10b of the insulating substrate 10 is exposed to the second main surface 1b.

The second main surface 1b, which is not provided with the shielding film 50, of the electronic component 1 serves as a mounting surface.

Figure 2:
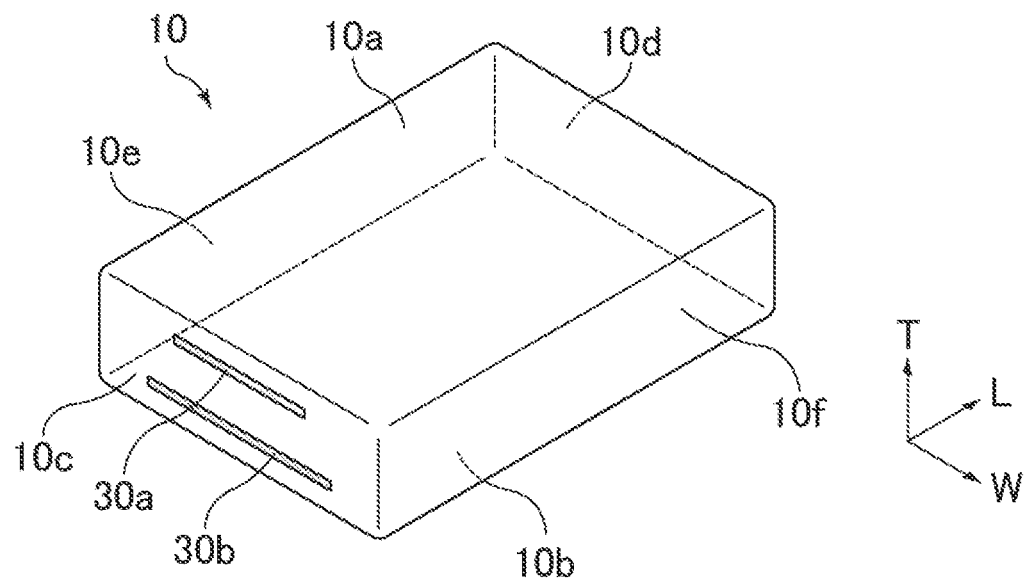
FIG. 2 is a schematic perspective view of an insulating substrate defining the electronic component illustrated in FIG. 1.

As illustrated in FIG. 2, the insulating substrate 10 defining the electronic component 1 includes a plurality of ground electrodes (a first ground electrode 30a and a second ground electrode 30b). The insulating substrate 10 has a substantially cubic shape including the first main surface 10a and the second main surface 10b opposite to each other in the thickness direction (the direction indicated by an arrow T in FIG. 2), the first side surface 10c and the second side surface 10d opposite to each other in the length direction (the direction indicated by an arrow L in FIG. 2) perpendicular to the thickness direction, and the third side surface 10e and the fourth side surface 10f opposite to each other in the width direction (the direction indicated by an arrow W in FIG. 2) perpendicular to the thickness direction and the length direction.

The ground electrodes exposed to the first side surface 10c includes the first ground electrode 30a exposed to the first side surface 10c of the insulating substrate 10 at a position closest to the first main surface 10a and the second ground electrode 30b exposed to the first side surface 10c of the insulating substrate 10 at a position closest to the second main surface 10b. The first ground electrode 30a and the second ground electrode 30b are provided at different positions in the thickness direction of the insulating substrate 10.

The first ground electrode 30a and the second ground electrode 30b at the first side surface 10c overlap each other in the thickness direction of the insulating substrate 10. Alternatively, the first ground electrode 30a and the second ground electrode 30b may not overlap each other in the thickness direction.

The first ground electrode 30a and the second ground electrode 30b may be exposed to a different side surface of the insulating substrate 10.

Figure 3:
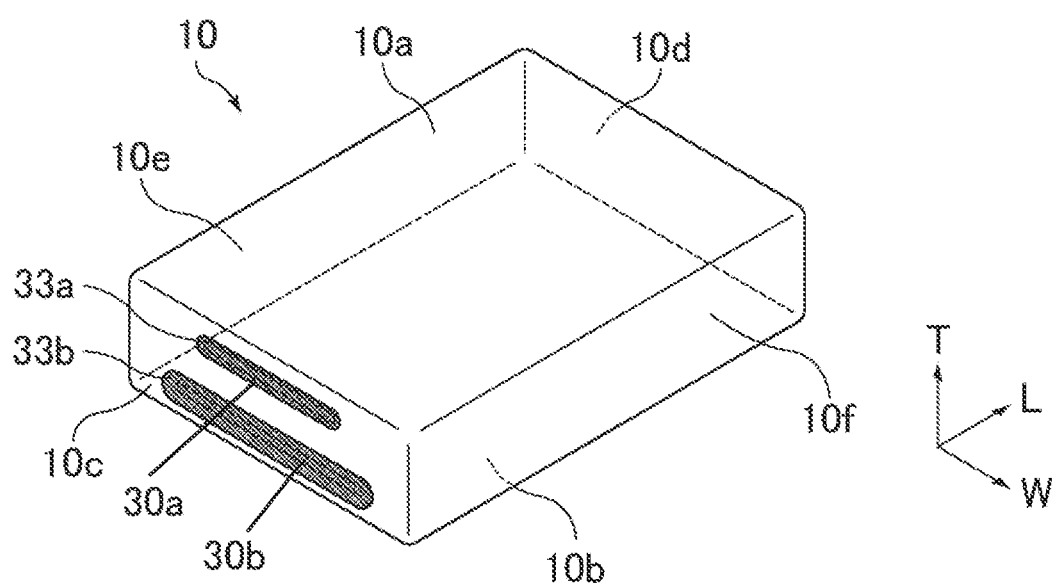
FIG. 3 is a schematic perspective view of the electronic component illustrated in FIG. 1 with a shielding film removed therefrom.

FIG. 3 is a schematic perspective view of the electronic component illustrated in FIG. 1 with the shielding film removed therefrom.

As illustrated in FIG. 3, the surface of the first ground electrode 30a and the surface of the second ground electrode 30b exposed to the first side surface 10c of the insulating substrate 10 are respectively provided with the first conductive film 33a and the second conductive film 33b.

The first conductive film 33a and the second conductive film 33b are formed by plating the first ground electrode 30a and the second ground electrode 30b. Thus, the first conductive film 33a and the second conductive film 33b protrude from the first side surface 10c of the insulating substrate 10.

Figure 4:
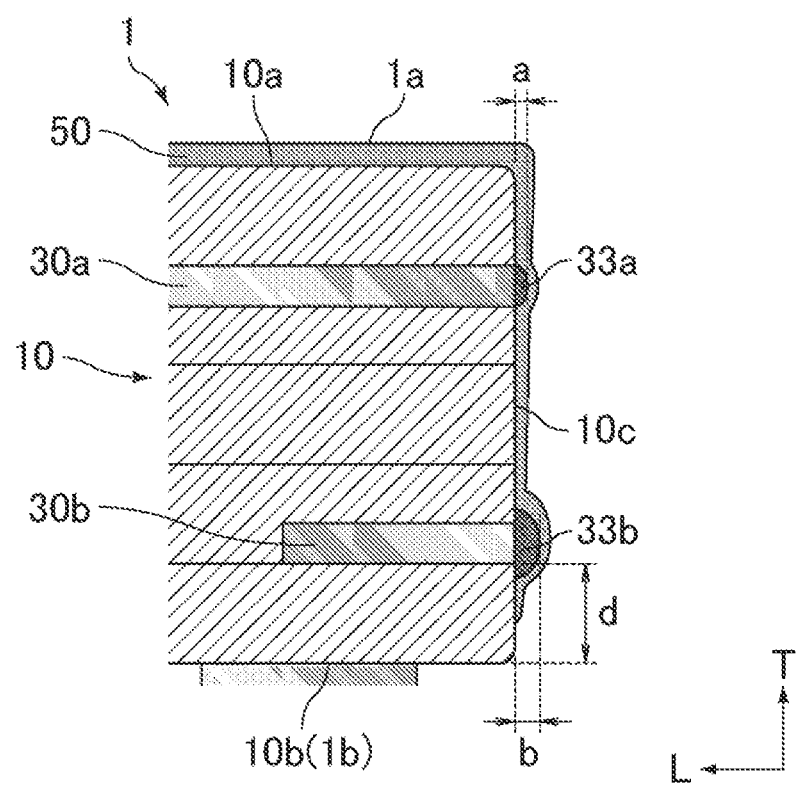
FIG. 4 is a schematic cross-sectional view of the electronic component illustrated in FIG. 1.

FIG. 4 is a schematic cross-sectional view of the electronic component illustrated in FIG. 1.

FIG. 4 is also an enlarged view of the first side surface 10c and its vicinity of the insulating substrate 10 of the electronic component 1 illustrated in FIG. 1.

As illustrated in FIG. 4, the surface of the first ground electrode 30a is covered with the first conductive film 33a. The surface of the second ground electrode 30b is covered with the second conductive film 33b.

The thickness (the length indicated by a double-headed arrow b in FIG. 4) of the second conductive film 33b is greater than the thickness (the length indicated by a double-headed arrow a in FIG. 4) of the first conductive film 33a.

Adjusting the thickness b of the second conductive film 33b to be greater than the thickness a of the first conductive film 33a allows the shielding film 50 to be less easily formed at a portion below (a portion closer to the second main surface 10b of) the second conductive film 33b. This can resultantly prevent unnecessary deposition of the shielding film 50 on the second main surface 10b of the insulating substrate 10.

In FIG. 4, i.e., in a side view of the insulating substrate 10, the distance between the second ground electrode 30b and the second main surface 10b of the insulating substrate 10 (the length indicated by a double-headed arrow d in FIG. 4) is greater than the thickness b of the second conductive film.

<Insulating Substrate>

The insulating substrate may be, for example, a stack of an insulating layer and a conductive line layer to serve as a conductive line.

Examples of the insulating material contained in the insulating layer include an insulating resin and a ceramic material.

An insulating substrate formed from an insulating resin as an insulating material is also referred to as a resin substrate, while an insulating substrate formed from a ceramic material as an insulating material is also referred to as a ceramic substrate.

Examples of the ceramic material include a high temperature co-fired ceramic (HTCC) material and a low temperature co-fired ceramic (LTCC) material.

The low temperature co-fired ceramic material means a ceramic material sinterable at a firing temperature of 1000° C. or lower and is co-fireable with a metallic material, preferably such as silver or copper, used to form a conductive line.

Examples of the low temperature co-fired ceramic material include those containing $SiO_2$—CaO—$Al_2O_3$—$B_2O_3$ glass ceramic or $SiO_2$—MgO—$Al_2O_3$—$B_2O_3$ glass ceramic.

Alumina powder may also be used as a ceramic material.

Examples of the insulating resin include epoxy resin, polyimide resin, and a liquid crystal polymer.

For example, the conductive line layer defines a passive element such as a capacitor or an inductor or defines a connection line that provides an electrical connection between elements.

Examples of the material defining the conductive line layer include silver and copper.

The conductive line layer may contain an insulating resin or a ceramic material.

The ceramic material contained in the conductive line layer may be the same as the ceramic material contained in the insulating layer. The insulating resin contained in the conductive line layer may be the same as the insulating resin contained in the insulating layer.

In the case where the conductive line layer contains not only a metallic material but also the same insulating material as the insulating material contained in the insulating layer, these materials are collectively referred to as a combined base material. For example, the composition of the combined base material may be such that the proportion of the metallic material to the total weight of the metallic material and the insulating material is 75% by weight or more and 95% by weight or less.

The insulating substrate may have any shape, such as a substantially cubic shape having a first main surface and a second main surface opposite to each other in the thickness direction, a first side surface and a second side surface opposite to each other in the length direction perpendicular to the thickness direction, and a third side surface and a fourth side surface opposite to each other in the width direction perpendicular to the thickness direction and the length direction.

The shape of the insulating substrate may be, for example, a substantially cubic shape having a thickness of 350 µm or greater and 1400 µm or smaller, a length of 1000 µm or greater and 4000 µm or smaller, and a width of 625 µm or greater and 2500 µm or smaller.

The second main surface of the insulating substrate may be provided with an electrode.

In this case, the shielding film may not be electrically connected to the electrode provided at the second main surface of the insulating substrate.

The electrode provided at the second main surface of the insulating substrate may be a ground electrode or may be a different electrode (circuit electrode).

A ground electrode that is provided at the second main surface of the insulating substrate but is not exposed to a side surface of the insulating substrate does not correspond to the second ground electrode.

The insulating substrate includes multiple ground electrodes exposed to a side surface.

Each ground electrode is a portion of the conductive line layer provided inside the insulating substrate and is a portion exposed to a side surface of the insulating substrate and electrically connected to the shielding film.

Using copper as a material of the ground electrodes can improve the plating adhesion. The ground electrodes may have a composition containing no insulating material such as an insulating resin or a ceramic material, or may be formed from a combined base material containing the same insulating material as that in the insulating layer.

Each ground electrode is exposed to a side surface of the insulating substrate and is electrically connected to the shielding film via the conductive film.

The ground electrodes each may have any thickness, such as 5 µm or greater and 20 µm or smaller.

The ground electrode that is exposed to a side surface of the insulating substrate at a position closest to the first main surface among the ground electrodes is defined as the first ground electrode.

The ground electrode that is exposed to a side surface of the insulating substrate at a position closest to the second main surface among the ground electrodes is defined as the second ground electrode.

The first ground electrode and the second ground electrode are provided at different layers in the thickness direction of the insulating substrate.

The first ground electrode and the second ground electrode may be exposed to the same side surface of the insulating substrate or may be exposed to different side surfaces.

The first ground electrode and the second ground electrode may be exposed such that they overlap each other in the thickness direction or may be exposed such that they do not overlap each other on the same side surface of the insulating substrate.

The electrical resistivity of the second ground electrode may be lower than the electrical resistivity of the first ground electrode.

Adjusting the electrical resistivity of the second ground electrode to be lower than the electrical resistivity of the first ground electrode causes an electric current to easily flow through a portion to be provided with the conductive film for the second ground electrode than through a portion to be provided with the conductive film for the first ground electrode during the plating treatment for forming the conductive films. As a result, the thickness of the second conductive film on the surface of the second ground electrode is more easily made greater than the thickness of the first conductive film on the surface of the first ground electrode.

The electrical resistivity of the second ground electrode may be made lower than the electrical resistivity of the first ground electrode by, for example, a method in which the amount of the ceramic component contained in the second ground electrode is made smaller than the amount of the ceramic component contained in the first ground electrode, or a method in which the metallic component to be contained in the second ground electrode is one having a lower electrical resistivity than the metallic component to be contained in the first ground electrode.

The electrical resistivity of the first ground electrode may be $3.0 \times 10^{-6}$ Ω·cm or higher and $5.0 \times 10^{-3}$ Ω·cm or lower, for example.

The electrical resistivity of the second ground electrode may be $1.5 \times 10^{-6}$ Ω·cm or higher and $5.0 \times 10^{-6}$ Ω·cm or lower, for example.

The total area of the second ground electrode exposed to a surface of the insulating substrate may be larger than the total area of the first ground electrode exposed to the surface of the insulating substrate. The larger the total area of the ground electrode exposed to the surface of the insulating substrate, the more easily an electric current flows through the ground electrode during the plating treatment for forming the conductive films. Accordingly, the thickness of the second conductive film on the surface of the second ground electrode is more easily made greater than the thickness of the first conductive film on the first ground electrode.

At the side surface of the insulating substrate where the second ground electrode is exposed, the length of the second ground electrode may be 50% or greater and 100% or smaller of the length of the insulating substrate. The length of the second ground electrode indicates the length of the second ground electrode in the direction substantially perpendicular to the thickness direction in a side view of the insulating substrate. In the case where two or more second ground electrodes are exposed to the same side surface, the length of the second ground electrode refers to the sum of the lengths of all second ground electrodes. The length of the insulating substrate refers to the length of the insulating substrate in the same direction as for the length of the second ground electrode.

Adjusting the length of the second ground electrode to be 50% or greater and 100% or smaller of the length of the insulating substrate allows the conductive film provided on the surface of the second ground electrode to sufficiently exert an effect of reducing unnecessary deposition of the shielding film on the second main surface of the insulating substrate.

In a side view of the insulating substrate, the length of a single ground electrode in the direction perpendicular to the thickness direction of the insulating substrate may be 50 µm or greater and 400 µm or smaller.

In a side view of the insulating substrate, the exposed area of the second ground electrode may be greater than the exposed area of the first ground electrode.

In the step of forming a conductive film on the surface of a ground electrode, the lower the electrical resistivity between a plating solution and the ground electrode is, the greater the electric current applied is and the thicker the resulting conductive film is.

Thus, adjusting the exposed area of the second ground electrode to be larger than the exposed area of the first ground electrode causes the electric current generated between the second ground electrode and the plating solution to be greater than the electric current flowing between the first ground electrode and the plating solution, resulting in a relatively thick conductive film on the surface of the second ground electrode.

The conductive films are each formed so as to cover the surface of a ground electrode exposed to a side surface of the insulating substrate. Thus, in the case where the exposed area of the second ground electrode is larger than the exposed area of the first ground electrode, the contact area between the second ground electrode and the second conductive film is larger than the contact area between the first ground electrode and the first conductive film.

The exposed areas of the first ground electrode and the second ground electrode each may be adjusted by, for example, a method of changing the thickness of the ground electrode or a method of changing the length (the length in the direction perpendicular to the thickness direction) of the ground electrode in a side view of the insulating substrate.

A third ground electrode different from the first ground electrode and the second ground electrode may be exposed to a side surface of the insulating substrate.

The side surface of the insulating substrate where the third ground electrode is exposed may be the same as or different from the side surface of the insulating substrate where the first ground electrode is exposed. The side surface of the insulating substrate where the third ground electrode is exposed may be the same as or different from the side surface of the insulating substrate where the second ground electrode is exposed.

<Conductive Films>

Conductive films covering the respective ground electrodes are provided on the surfaces of the ground electrodes exposed to a side surface of the insulating substrate.

The material defining the conductive films may be selected as appropriate in accordance with the material defining the ground electrodes to serve as bases (hereinafter, also referred to as base electrodes) and the material defining the shielding film.

Examples of the material defining the conductive films include Ni, Sn, and Au, and two or more species may be used in combination.

The material defining the conductive films may be a material having higher malleability than the material defining the ground electrodes.

The conductive films may be formed by plating, for example.

Each conductive film may have two or more layers.

The first layer of the conductive film may be an electroplated layer formed by electroplating.

For the conductive film having two or more layers, examples of the layers include a combination of an electroplated Ni layer and an electroplated Sn layer and a combination of an electroplated Ni layer and an electroless-plated Au layer.

Using Ni as a material defining the first layer of the conductive film can improve the connection with the base electrode in the case where the ground electrode serving as the base contains Cu or Ag.

The conductive film covering the surface of the first ground electrode among the conductive films is referred to as a first conductive film.

The conductive film covering the surface of the second ground electrode among the conductive films is referred to as a second conductive film.

The thickness of the second conductive film is greater than the thickness of the first conductive film.

The compositions of the first conductive film and the second conductive film may be the same as or different from each other.

The thicknesses of the first conductive film and the second conductive film can be measured by, for example, SEM observation on a cross section obtained by cutting the electronic component along the direction perpendicular to the side surface of the insulating substrate provided with the conductive films and perpendicular to the thickness direction of the insulating substrate.

In the case where a conductive film includes two or more layers, the thickness of the conductive film is the sum of the thicknesses of the respective layers.

The thickness of each conductive film may be 1 µm or greater and 7 µm or smaller.

A conductive film having a thickness of smaller than 1 µm may cause poor connection between the corresponding ground electrode and the shielding film.

A conductive film having a thickness of greater than 7 µm may cause insufficient formation of the shielding film at a position farther (from the target) than the conductive film in the step of forming the shielding film.

The thickness of the second conductive film may be 3 µm or greater and 7 µm or smaller, for example.

A second conductive film having a thickness of smaller than 3 μm may cause a failure in sufficiently reducing unnecessary deposition of the shielding film on the second main surface.

The thickness of the first conductive film may be 1 μm or greater and 3 μm or smaller, for example.

The contact area between the second ground electrode and the second conductive film may be greater than the contact area between the first ground electrode and the first conductive film.

Adjusting the contact area between the second ground electrode and the second conductive film to be greater than the contact area between the first ground electrode and the first conductive film causes the contact area between the second ground electrode and the plating solution to be greater than the contact area between the first ground electrode and the plating solution during the plating treatment for forming the conductive films, which causes an electric current flowing through the second ground electrode to be higher than an electric current flowing through the first ground electrode. As a result, the thickness of the second conductive film on the surface of the second ground electrode is more easily made greater than the thickness of the first conductive film on the surface of the first ground electrode.

The contact area between the second ground electrode and the second conductive film may be made greater than the contact area between the first ground electrode and the first conductive film by, for example, a method of adjusting the thickness of the second ground electrode to be greater than the thickness of the first ground electrode or a method of adjusting the length of the second ground electrode to be greater than the length of the first ground electrode, thereby adjusting the area of the second ground electrode exposed to a side surface of the insulating substrate to be greater than the area of the first ground electrode exposed to the side surface of the insulating substrate.

<Shielding Film>

The shielding film covers at least side surfaces among the surfaces of the insulating substrate.

The shielding film is a metal film formed by sputtering.

The shielding film may have any average thickness, such as 1 μm or greater and 50 μm or smaller.

The shielding film may have a single layer, or may have a multilayer structure.

An example of the multilayer structure of the shielding film is a structure sequentially including an adhesive layer, a conductive layer, and an anticorrosive layer from the side close to the insulating substrate.

Examples of the material defining the adhesive layer include metals such as SUS, Cu, Ti, Cr, Ni, and TiAl.

Examples of the material defining the conductive layer include metals such as Cu, Ni, Ag, and Al.

Examples of the material defining the anticorrosive layer include metals such as SUS, Ti, Cr, and TiAl and metals having a high magnetic permeability such as Ni and permalloy.

The adhesive layer, the conductive layer, and the anticorrosive layer each may be formed by sputtering.

Examples of the shielding film include those including any one of the adhesive layer, the conductive layer, and the anticorrosive layer, those including at least a conductive layer, and those including all of the adhesive layer, the conductive layer, and the anticorrosive layer.

<Method for Producing Electronic Component>

Next, an example of a method for producing an electronic component is described.

Described below is a case where a LTCC material is used as a ceramic material.

First, LTCC green sheets to define ceramic layers are produced.

In this case, predetermined amounts of a ceramic powder, a binder, and a plasticizer are mixed, whereby slurry is prepared. The resulting slurry is applied to a carrier film for sheet formation, whereby a green sheet is produced. The slurry may be applied to the carrier film using a lip coater, a doctor blade, or the like.

The green sheet may have any thickness, such as 4 μm or greater and 100 μm or smaller.

Next, the green sheet is provided with a via hole at a predetermined site. The via hole may be formed by punching or laser processing, for example.

The via hole may have any diameter, such as 20 μm or greater and 200 μm or smaller.

Next, the via hole is filled with conductive paste. The conductive paste filling the via hole is fired to form a via conductor.

The conductive paste may be prepared by mixing powder of Cu or other metal, a plasticizer, an organic solvent, and other components with a binder. This conductive paste may be further combined with a ceramic material.

Next, conductive paste is printed on a main surface of the green sheet.

The conductive paste used in this step may be prepared by mixing Cu powder, glass powder, a plasticizer, an organic solvent, and other components with a binder.

The conductive paste may be printed by screen printing, inkjet printing, gravure printing, or the like.

The printed conductive paste is fired to form a conductive line layer.

Next, multiple green sheets each provided with the conductive paste to serve as a conductive line layer and the conductive paste to serve as a via conductor are stacked, and this stack is compressed in a mold. The pressure and the temperature at this step may be set as appropriate.

Next, the compressed stack is singulated.

Singulation may be performed by dicing, guillotine cutting, laser cutting, or the like.

If necessary, the singulated stacks may be subjected to barrel finishing.

The conductive line layers exposed to a side surface of a stack by singulation serve as ground electrodes.

Barrel finishing may be performed by putting a stack and media into a pot of a rotary barrel and rotating the pot, for example.

In order to prevent cracking or chipping of the stack, the inside of the pot may be coated with an elastic material such as rubber.

Next, the singulated stacks are fired.

In the case of a Cu-based conductive paste, the stacks are preferably fired in a reducing atmosphere (e.g., $N_2$ atmosphere).

The stacks may be arranged in a firing setter.

The firing may be performed in a batch manner or in a belt (continuous) manner.

Then, the surfaces of the ground electrodes exposed to a side surface of the insulating substrate are plated. This plating treatment on the surfaces of the ground electrodes forms conductive films that improve the connection between the ground electrodes and the shielding film. The ground electrode closest to the second main surface, which is to be the mounting surface, corresponds to the second ground electrode, while the ground electrode closest to the opposite first main surface corresponds to the first ground electrode.

Examples of the plated layer formed by the plating treatment include a combination of a plated Ni layer and a plated Sn layer and a combination of a plated Ni layer and an electroless-plated Au layer.

These steps provide an insulating substrate.

The first main surface and/or the second main surface of the insulating substrate may be provided with any component such as an electronic component or may be encapsulated with a mold resin.

The mold resin used may be a common encapsulating resin such as a glass epoxy resin, for example.

Then, multiple insulating substrates are arranged in a tray for sputtering.

In order to prevent unnecessary deposition of the sputtering film (shielding film) on the surface to be the mounting surface (the second main surface) of each insulating substrate, paste or tape may be attached to this surface in advance.

Adjacent insulating substrates arranged in the tray may be apart from each other at any distance, such as 0.5 μm or greater and 5 mm or smaller.

If necessary, dry etching may be performed before sputtering.

Dry etching may be performed using an Ar ion gun.

Dry etching enables washing of the insulating substrates, as well as coarsening of the surfaces of the insulating substrates, improving the adhesive strength of the shielding film.

Next, the tray for sputtering is placed inside the chamber of a sputtering device and an adhesive layer is formed.

Formation of the adhesive layer is achieved by applying a voltage to a SUS target for a predetermined period of time. The thickness thereof may be, for example, about 0.01 μm or greater and about 0.5 μm or smaller.

Instead of the SUS target, a Ti, Cr, Ni, or TiAl target may be used.

The sputtering device may be of any type, such as an in-line type, a batch type, or a single piece type.

Next, a conductive layer is formed on the adhesive layer by sputtering.

Formation of the conductive layer is achieved by applying a voltage to a Cu target for a predetermined period of time.

The thickness thereof may be adjusted to be about 0.9 μm or greater and about 3.0 μm or smaller at a portion covering a side surface of the insulating substrate. In this case, the thickness at a portion covering the first main surface of the insulating substrate is about 3 μm or greater and about 10 μm or smaller.

Instead of the Cu target, a Ag or Al target may be used.

Next, an anticorrosive layer is formed on the conductive layer by sputtering, whereby an electronic component is obtained.

Formation of the anticorrosive layer is achieved by applying a voltage to a SUS target for a predetermined period of time.

The thickness thereof may be, for example, about 0.03 μm or greater and about 1.5 μm or smaller.

Instead of the SUS target, a Ti, Cr, Ni, TiAl, or permalloy target may be used. Using a material having a high magnetic permeability such as Ni or permalloy instead of the SUS target allows the shielding film to have an improved electromagnetic-shielding effect.

The electronic component may be a chip component or a substrate.

A component further including a passive element incorporated in the insulating substrate is an example of the electronic component used as a chip component.

Examples of the passive element include a capacitor and an inductor.

A component further including a different electronic component mounted on the insulating substrate is an example of the electronic component used as a substrate.

The different electronic component may be mounted on the first main surface and/or the second main surface of the insulating substrate.

Examples of the different electronic component include a multilayer ceramic capacitor and a multilayer chip coil.

The electronic component may be combined with a different electronic component and a substrate into a module.

The module may be a module including a substrate and an electronic component mounted on the substrate, for example.

An example of the module is a RF module.

EXAMPLES

The following provides examples that more specifically disclose the electronic component of the present disclosure. The present disclosure is not limited to these examples.

Example 1

Borosilicate glass powder containing CaO, $Al_2O_3$, $SiO_2$, and $B_2O_3$ was prepared as a starting material.

This borosilicate glass powder is a low temperature co-fired ceramic material.

The borosilicate glass powder was combined and mixed with appropriate amounts of a binder, a dispersing agent, a plasticizer, an organic solvent, and other components, whereby ceramic slurry was produced.

The ceramic slurry was degassed and formed into a green sheet having a thickness of 70 μm by a doctor blade method.

Next, the green sheet was punched so that it was provided with through holes and the through holes were filled with a silver-containing conductive paste, whereby via conductors were formed.

The silver-containing conductive paste contained glass powder, which is the low temperature co-fired ceramic contained in the green sheet (i.e., the conductive paste corresponds to a combined base material). The weight proportion of the low temperature co-fired ceramic material to the total weight of the metal and the low temperature co-fired ceramic material in the conductive paste was 10%.

The same conductive paste as the conductive paste filling the through holes was printed on the surface of the green sheet, whereby a conductive line layer to be a ground electrode was formed. In this step, the conductive line layer to be the first ground electrode exposed at a position closest to the first main surface of the insulating substrate and the conductive line layer to be the second ground electrode exposed at a position closest to the second main surface of the insulating substrate were made to have different thicknesses and lengths.

Then, 20 green sheets were stacked to form a stack and the stack was pressed in the thickness direction.

Next, the pressed stack was fired at 900° C., whereby an insulating substrate was obtained.

The low temperature co-fired ceramic material and the conductive paste were co-fired, whereby insulating layers, conductive line layers, and ground electrodes were formed.

For the thickness per single insulating layer formed after the firing, the thickness was 35 μm in the form of insulating layer in the case where the thickness was 70 μm in the form of green sheet. The resulting stack was singulated using a dicer and subjected to barrel finishing, whereby insulating substrates were obtained.

Each of the resulting insulating substrates had a substantially cubic shape having a length of 2000 μm, a width of 1250 μm, and a thickness of 700 μm.

Two ground electrodes were exposed to one side surface (a side surface having dimensions in a side view including a width of 1250 μm and a thickness of 700 μm) of the resulting insulating substrate at different positions of the insulating substrate. The ground electrode exposed at a position closest to the first main surface corresponds to the first ground electrode, while the ground electrode exposed at a position closest to the second main surface corresponds to the second ground electrode.

In a side view of the insulating substrate, the first ground electrode was at a position 150 μm apart from the first main surface, while the second ground electrode was at a position 150 μm apart from the second main surface.

In a side view of the insulating substrate, the first ground electrode had a thickness of 5 μm and a length of 200 μm. In a side view of the insulating substrate, the second ground electrode had a thickness of 10 μm and a length of 500 μm.

The second main surface of the insulating substrate was provided with two external electrodes serving as input/output terminals of the electronic component, a first mounted electrode, and a second mounted electrode. The first mounted electrode corresponds to a portion of the first ground electrode exposed to the second main surface of the insulating substrate through a via conductor. The second mounted electrode corresponds to a portion of the second ground electrode exposed to the second main surface of the insulating substrate through a via conductor. The first mounted electrode connected to the first ground electrode had a plan view area of 0.16 mm² and the second mounted electrode connected to the second ground electrode had a plan view area of 0.16 mm².

<Formation of Conductive Films>

The insulating substrate was successively subjected to Ni electroplating and Sn electroplating, whereby Ni—Sn conductive films were formed on the surfaces of the ground electrodes.

Another insulating substrate after the plating treatments under the same conditions was cut and the cross section was observed by SEM to measure the thicknesses of the conductive films. The total thickness of the first conductive film was 1 μm and the total thickness of the second conductive film was 5 μm.

<Formation of Shielding Film>

The insulating substrate was placed inside the chamber of a sputtering device and the following layers were formed in the stated order so that the shielding film was formed, whereby an electronic component was produced. The thicknesses of the layers of the shielding film formed on the surface of the first ground electrode were adjusted to the following values: 1) Adhesive layer: SUS target, thickness 0.3 μm, 2) Conductive layer: Cu target, thickness 1.0 μm, 3) Anticorrosive layer: SUS target, thickness 0.7 μm.

Comparative Example 1

An insulating substrate was produced in the same procedure as in Example 1 except that the shape and thickness of the conductive paste printed on the green sheet were changed, that the thicknesses of the first ground electrode and the second ground electrode exposed to a side surface of the insulating substrate were both 5 μm, and that the lengths thereof were both 200 μm. Then, plating treatment and formation of a shielding film were performed under the same conditions as in Example 1, whereby an electronic component of Comparative Example 1 was obtained.

The first conductive film formed on the surface of the first ground electrode had a thickness of 1 μm.

The second conductive film formed on the surface of the second ground electrode had a thickness of 1 μm.

Example 2

An electronic component was produced in the same procedure as in Comparative Example 1 except that the metallic component contained in the conductive paste to be the second ground electrode was changed from silver to copper and that the weight proportion of the low temperature co-fired ceramic material was changed to 0%.

The first ground electrode had an electrical resistivity of $2.0 \times 10^{-3}$ Ω·cm.

The second ground electrode had an electrical resistivity of $2.0 \times 10^{-6}$ Ω·cm.

The first conductive film formed on the surface of the first ground electrode had a thickness of 1 μm.

The second conductive film formed on the surface of the second ground electrode had a thickness of 3 μm.

Example 3

An electronic component was produced in the same procedure as in Comparative Example 1 except that the plan view dimension of the second mounted electrode connected to the second ground electrode was changed from 0.16 mm² to 0.32 mm².

The first conductive film formed on the surface of the first ground electrode had a thickness of 1 μm.

The second conductive film formed on the surface of the second ground electrode had a thickness of 4 μm.

<Check for Unnecessary Deposition of Shielding Film on Second Main Surface>

Ten electronic components were selected in each of the examples and the comparative example. SEM-EDX elemental analysis was performed on a region of the second main surface of the insulating substrate where neither the first mounted electrode nor the second mounted electrode was provided, thereby checking for whether any metallic component derived from the shielding film was contained or not.

In every sample of Examples 1 to 3, no metallic component derived from the shielding film was detected on the second main surface. In three samples out of the ten samples of Comparative Example 1, a metallic component derived from the shielding film was detected on the second main surface. The electronic components of Examples 1 to 3 were confirmed that the shielding film was not unnecessarily deposited on the second main surface of the insulating substrate. The electronic components of Comparative Example 1 were confirmed that the shielding film was unnecessarily deposited on the second main surface of the insulating substrate.

<Short Circuit Test>

Next, a voltage was applied between the two external electrodes of each electronic component according to the examples and the comparative example to check for any short circuit. In all ten samples of each of Examples 1 to 3, no short circuit occurred. In Comparative Example 1, a short circuit occurred in the electronic components in which a metallic component derived from the shielding film was detected on the second main surface.

Consequently, the electronic component of the present disclosure seems to prevent unnecessary deposition of the shielding film and less easily cause short circuits.

1: electronic component
1a: first main surface of electronic component
1b: second main surface of electronic component
1c: first side surface of electronic component
1d: second side surface of electronic component
1e: third side surface of electronic component
1f: fourth side surface of electronic component
10: insulating substrate
10a: first main surface of insulating substrate
10b: second main surface of insulating substrate
10c: first side surface of insulating substrate
10d: second side surface of insulating substrate
10e: third side surface of insulating substrate
10f: fourth side surface of insulating substrate
30a: first ground electrode
30b: second ground electrode
33a: first conductive film
33b: second conductive film
50: shielding film

The invention claimed is:

1. An electronic component comprising:
an insulating substrate including a first main surface, a second main surface, a side surface and a plurality of ground electrodes, the first main surface and the second main surface being opposite to each other in a thickness direction, and the plurality of ground electrodes being exposed to the side surface;
conductive films each covering a surface of a corresponding one of the plurality of ground electrodes exposed to the side surface of the insulating substrate; and
a shielding film covering the first main surface and the side surface of the insulating substrate and surfaces of the conductive films,
the plurality of ground electrodes including a first ground electrode and a second ground electrode, the first ground electrode being exposed to the side surface of the insulating substrate at a position closest to the first main surface of the insulating substrate and the second ground electrode being exposed to the side surface of the insulating substrate at a position closest to the second main surface of the insulating substrate,
the conductive films including a first conductive film covering a surface of the first ground electrode and a second conductive film covering a surface of the second ground electrode,
a thickness of the second conductive film being greater than a thickness of the first conductive film.

2. The electronic component according to claim 1, wherein the shielding film is not electrically connected to an electrode provided at the second main surface of the insulating substrate.

3. The electronic component according to claim 2, wherein an electrical resistivity of the second ground electrode is lower than an electrical resistivity of the first ground electrode.

4. The electronic component according to claim 2, wherein a contact area between the second ground electrode and the second conductive film is larger than a contact area between the first ground electrode and the first conductive film.

5. The electronic component according to claim 3, wherein a contact area between the second ground electrode and the second conductive film is larger than a contact area between the first ground electrode and the first conductive film.

6. The electronic component according to claim 2, wherein a total area of the second ground electrode exposed to a surface of the insulating substrate is smaller than a total area of the first ground electrode exposed to the surface of the insulating substrate.

7. The electronic component according to claim 2, wherein the first conductive film and the second conductive film are apart from each other.

8. The electronic component according to claim 2, wherein the first conductive film and the second conductive film have different compositions.

9. The electronic component according to claim 1, wherein an electrical resistivity of the second ground electrode is lower than an electrical resistivity of the first ground electrode.

10. The electronic component according to claim 9, wherein a total area of the second ground electrode exposed to a surface of the insulating substrate is smaller than a total area of the first ground electrode exposed to the surface of the insulating substrate.

11. The electronic component according to claim 9, wherein the first conductive film and the second conductive film are apart from each other.

12. The electronic component according to claim 9, wherein the first conductive film and the second conductive film have different compositions.

13. The electronic component according to claim 1, wherein a contact area between the second ground electrode and the second conductive film is larger than a contact area between the first ground electrode and the first conductive film.

14. The electronic component according to claim 13, wherein a total area of the second ground electrode exposed to a surface of the insulating substrate is smaller than a total area of the first ground electrode exposed to the surface of the insulating substrate.

15. The electronic component according to claim 13, wherein the first conductive film and the second conductive film are apart from each other.

16. The electronic component according to claim 1, wherein a total area of the second ground electrode exposed to a surface of the insulating substrate is smaller than a total area of the first ground electrode exposed to the surface of the insulating substrate.

17. The electronic component according to claim 16, wherein the first conductive film and the second conductive film are apart from each other.

18. The electronic component according to claim 1, wherein the first conductive film and the second conductive film are apart from each other.

19. The electronic component according to claim 1, wherein the first conductive film and the second conductive film have different compositions.

20. The electronic component according to claim 1, wherein the first conductive film covers only the surface of the first ground electrode and a vicinity thereof and the second conductive film covers only the surface of the second ground electrode and a vicinity thereof.

* * * * *